(12) United States Patent
Lee et al.

(10) Patent No.: US 10,734,526 B2
(45) Date of Patent: Aug. 4, 2020

(54) DISPLAY DEVICE AND METHOD OF MANUFACTURING THE SAME

(71) Applicant: Samsung Display Co., Ltd., Yongin-si, Gyeonggi-do (KR)

(72) Inventors: Jong Chan Lee, Suwon-si (KR); Kyoung Won Lee, Seoul (KR); Woong Hee Jeong, Seoul (KR); Yong Su Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 35 days.

(21) Appl. No.: 15/729,120

(22) Filed: Oct. 10, 2017

(65) Prior Publication Data

US 2018/0114866 A1 Apr. 26, 2018

(30) Foreign Application Priority Data

Oct. 24, 2016 (KR) .......................... 10-2016-0138377

(51) Int. Cl.
*H01L 29/786* (2006.01)
*H01L 29/49* (2006.01)
(Continued)

(52) U.S. Cl.
CPC .... *H01L 29/78621* (2013.01); *H01L 21/2253* (2013.01); *H01L 21/266* (2013.01);
(Continued)

(58) Field of Classification Search
CPC .......... H01L 29/78621; H01L 29/4908; H01L 29/42384; H01L 29/66757;
(Continued)

(56) References Cited

U.S. PATENT DOCUMENTS 6,433,361 B1* 8/2002 Zhang ................ H01L 27/1214
257/59
2007/0263131 A1* 11/2007 Uemoto ............ G02F 1/136213
349/39
(Continued)

FOREIGN PATENT DOCUMENTS

KR 1020060018134 A 2/2006
KR 100590265 B1 6/2006
KR 101002045 B1 12/2010

OTHER PUBLICATIONS

Feng-Tso Chien, "A New RSD Poly-Si Thin Film Transistor With Inside Spacer Design", IEEE Transactions on Electron Devices, vol. 57, No. 5, May 2010, pp. 1173-1177.
(Continued)

*Primary Examiner* — Shan Liu
(74) *Attorney, Agent, or Firm* — Cantor Colburn LLP

(57) ABSTRACT

A display device includes: a flexible substrate; a semiconductor layer on the flexible substrate; a passivation layer on the semiconductor layer; an alignment member layer on the passivation, the alignment member layer including a first alignment member and a second alignment member in a same layer; a first insulation layer on the alignment member layer and the passivation layer; a gate electrode on the first insulation layer; a second insulation layer on the first insulation layer and the gate electrode; and a source electrode and a drain electrode on the second insulation layer and spaced apart from each other, wherein the first alignment member and the second alignment member are spaced apart from each other with the gate electrode therebetween.

9 Claims, 5 Drawing Sheets

(51) Int. Cl.
  *H01L 21/225* (2006.01)
  *H01L 21/265* (2006.01)
  *H01L 21/266* (2006.01)
  *H01L 29/423* (2006.01)
  *H01L 29/66* (2006.01)
  *G02F 1/1333* (2006.01)
  *H01L 27/32* (2006.01)
  *G02F 1/1368* (2006.01)
  *H01L 27/12* (2006.01)

(52) U.S. Cl.
  CPC .... *H01L 21/2652* (2013.01); *H01L 29/42384* (2013.01); *H01L 29/4908* (2013.01); *H01L 29/66757* (2013.01); *H01L 29/78603* (2013.01); *H01L 29/78675* (2013.01); *G02F 1/1368* (2013.01); *G02F 1/133305* (2013.01); *G02F 2001/13685* (2013.01); *H01L 27/1214* (2013.01); *H01L 27/3244* (2013.01); *H01L 27/3262* (2013.01); *H01L 2029/42388* (2013.01); *H01L 2029/7863* (2013.01); *H01L 2251/5338* (2013.01)

(58) Field of Classification Search
  CPC ......... H01L 29/78603; H01L 29/78675; H01L 21/2253; H01L 21/2652; H01L 21/266; H01L 27/3262; H01L 2251/5338; H01L 27/3244; H01L 2029/7863; H01L 2029/42388; H01L 2021/775; H01L 27/2436; H01L 29/66037; H01L 29/66068; H01L 29/66227; H01L 29/72; H01L 29/786; H01L 2924/1304; H01L 51/0504; H01L 51/0508; H01L 27/1214–1296; G02F 1/133305; G02F 1/1368; G02F 2001/13685; G02F 1/13439; G02F 1/1362; G02F 1/136209; G02F 1/136227; G02F 1/1365; G02F 2001/136218; G02F 2001/136222; G02F 2001/136231; G02F 2001/13625; G02F 2001/1635; G02F 2201/122; G02F 2202/10
  USPC .................................. 349/42–43; 257/59, 72
  See application file for complete search history.

(56) References Cited

U.S. PATENT DOCUMENTS

| | | | |
|---|---|---|---|
| 2011/0127589 A1* | 6/2011 | Chen | H01L 29/495 257/288 |
| 2014/0117323 A1* | 5/2014 | Ahn | H01L 27/1288 257/40 |
| 2015/0015530 A1* | 1/2015 | Kim | G06F 3/044 345/174 |
| 2015/0102430 A1 | 4/2015 | Hui et al. | |
| 2015/0187946 A1* | 7/2015 | Park | H01L 29/66795 257/368 |
| 2016/0238916 A1* | 8/2016 | Umezaki | G09G 3/342 |

OTHER PUBLICATIONS

Liou et al., "A Novel Poly-Si Thin Film Transistor with ONO Offset structure", Department of Electronic Engineering, Feng-Chia University, Taichung 407, Taiwan, Sep. 2017, p. 25.

* cited by examiner

DISPLAY DEVICE AND METHOD OF MANUFACTURING THE SAME

This application claims priority to Korean Patent Application No. 10-2016-0138377 filed on Oct. 24, 2016, and all the benefits accruing therefrom under 35 U.S.C. § 119, the content of which in its entirety is herein incorporated by reference.

BACKGROUND

(a) Field

The present disclosure relates to a display device.

(b) Description of the Related Art

A display device includes a substrate, a signal line and a transistor. The signal line and the transistor are disposed on the substrate. The transistor includes a semiconductor layer that is formed of polysilicon.

To form the semiconductor layer of polysilicon, an amorphous silicon material layer is formed and then crystallized. In addition, a polysilicon portion doped with a conductive impurity is activated such that the semiconductor layer includes a relatively heavily doped region and a relatively lightly doped region.

A flexible display device has been highlighted, and includes a flexible substrate on which layers such as the semiconductor layer are formed.

SUMMARY

Exemplary embodiments of the invention provide improved reliability of a transistor included in a display device.

A display device according to an exemplary embodiment includes: a flexible substrate; a semiconductor layer on the flexible substrate; a passivation layer on the semiconductor layer; an alignment member layer on the passivation, the alignment member layer including a first alignment member and a second alignment member in a same layer; a first insulation layer on the alignment member layer and the passivation layer; a gate electrode on the first insulation layer; a second insulation layer on the first insulation layer and the gate electrode; and a source electrode and a drain electrode on the second insulation layer and spaced apart from each other, wherein the first alignment member and the second alignment member are spaced apart from each other with the gate electrode therebetween.

Wherein in a direction along the flexible substrate, the first alignment member and the second alignment member may be respectively disposed between the gate electrode, and each of the source electrode and the drain electrode.

The semiconductor layer may include a polysilicon doped with a conductive impurity.

The semiconductor layer may include a source region, a drain region, doped regions and a channel region, and the doped regions may be respectively between the source region and the channel region, and the drain region and the channel region.

The first alignment member and the second alignment member may be respectively disposed corresponding to the doped regions, and the gate electrode may correspond to the channel region.

The source electrode may be connected with the source region, and the drain electrode may be connected with the drain region.

The display device according to the exemplary embodiment may further include: a planarization layer on the source electrode and the drain electrode; a light emitting diode on the planarization layer and connected with the drain electrode; and an encapsulation layer on the light emitting diode.

The display device according to the exemplary embodiment may further include: a planarization layer on the source electrode and the drain electrode; a first electrode on the planarization layer and connected with the drain electrode; an opposed electrode facing the first electrode; and an optical transmittance layer between the first electrode and the opposed electrode.

According to an exemplary embodiment, a method for manufacturing a display device is disclosed. The manufacturing method includes: sequentially forming an amorphous silicon material layer and a passivation layer on a flexible substrate; forming a mask pattern on the passivation layer; forming a first alignment member and a second alignment member on the passivation layer at opposing sides of the mask pattern; with the mask pattern, the first alignment member and the second alignment member on the amorphous silicon material layer, injecting a conductive impurity to the amorphous silicon material layer through a first doping process to form a first-doped amorphous silicon layer; with the mask pattern removed from the passivation layer, injecting the conductive impurity to the first-doped amorphous silicon layer through a second doping process to form a second-doped amorphous silicon layer; forming a semiconductor layer by crystallizing the second-doped amorphous silicon layer; forming a first insulation layer on the semiconductor layer and on the first alignment member and the second alignment member spaced apart from each other; forming a gate electrode on the first insulation layer between the first and second alignment members spaced from each other; forming a second insulation layer on the first insulation layer and the gate electrode; and forming a source electrode and a drain electrode on the second insulation layer to be spaced apart from each other with respect to the gate electrode.

In the forming of the semiconductor layer, a portion of the second-doped amorphous silicon layer doped with the conductive impurity may be activated.

A concentration of the conductive impurity injected during the first doping process may be heavier than a concentration of the conductive impurity injected during the second doping process.

According to one or more exemplary embodiment, reliability of the transistor included in the display device can be improved.

Further, according to the exemplary embodiments, a manufacturing process of the display device, and more particularly, a manufacturing process of the transistor can be simplified.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
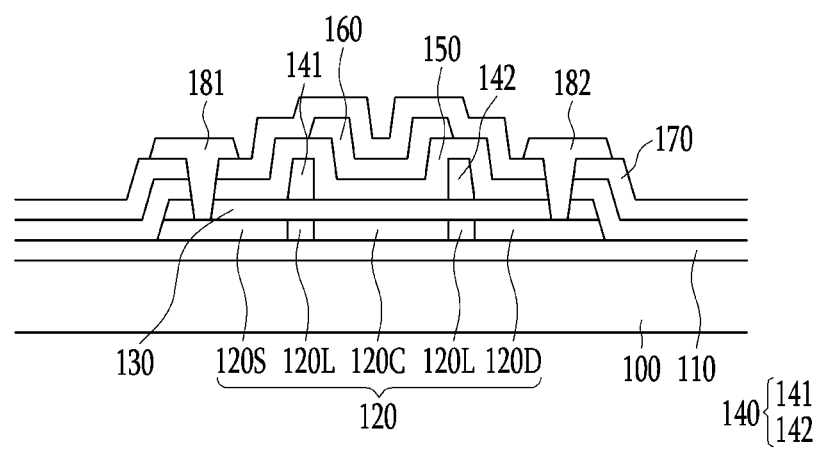
FIG. 1 is a schematic cross-sectional view of an exemplary embodiment of transistor of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

Throughout the specification, the word "on" means positioning on or below the object portion, but does not essentially mean positioning on the upper side of the object portion based on a gravitational direction. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

In this specification, the phrase "on a plane" means viewing a target portion from the top, and the phrase "on a cross-section" means viewing a cross-section formed by vertically cutting a target portion from the side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A display device such as a flexible display, includes a switching element such as transistor connected to a signal line. The transistor may include a semiconductor layer that includes or is formed of polysilicon. To form the semiconductor layer of polysilicon, an amorphous silicon material layer is formed and then crystallized. In addition, in forming the semiconductor layer, a polysilicon portion doped with a conductive impurity is activated such that the semiconductor layer includes a relatively heavily doped region and a relatively lightly doped region.

However, in forming such a semiconductor layer on a flexible substrate of the flexible display device, the flexible substrate may be damaged due to temperature such as during activation of the portion of the semiconductor layer.

Referring to FIG. 1, an exemplary embodiment of a transistor according to the invention will be described.

FIG. 1 schematically shows a cross-section of an exemplary transistor according to the invention. Such cross-section is taken in a thickness direction of a display device in which the transistor is employed Referring to FIG. 1, a buffer layer 110 is disposed on a substrate 100.

The substrate 100 may be a flexible substrate that includes a material having excellent heat resistance and durability such as polyethylene naphthalate ("PEN"), polycarbonate ("PC"), polyarylate ("PAR"), polyether imide ("PEI"), polyether sulfone ("PES"), polyimide ("PI") and the like. Alternatively, the substrate 100 may be a flexible substrate including or formed of various materials having flexibility.

The buffer layer 110 may be disposed or formed of a single silicon nitride layer structure (SiNx) or a double layer structure in which a silicon nitride (SiNx) and a silicon oxide (SiOx) are laminated. The buffer layer 110 not only reduces or effectively prevents unnecessary materials such as impurities or moisture from permeating into layers of the transistor, but also serves to provide a planarized surface on which such layers are disposed. Such a buffer layer 110 may be omitted depending on a kind of substrate 100 and a process condition during manufacturing of the transistor.

A semiconductor layer 120 is disposed on the buffer layer 110. The semiconductor layer 120 may include a polysilicon in which a conductive impurity is doped. The semiconductor layer 120 includes a source region 120S, a drain region 120D, a channel region 120C and lightly doped regions 120L. The lightly doped regions 120L are disposed between the source region 120S and the channel region 120C, and between the drain region 120D and the channel region 120C.

The substrate 100 may be disposed in a plane defined by first and second directions, while a thickness of the substrate 100 is disposed in a third direction crossing each of the first and second directions. In either of the first or second direction (e.g., horizontal in FIG. 1), a width of the lightly doped region 120L may be smaller than a width of each of the source region 120S, the drain region 120D, and the channel region 120C. The widths may be maximum dimensions of a respective region in the first (or second) direction.

Each of the lightly doped regions 120L, the source region 120S, the drain region 120D and the channel region 120C may be formed from a same initial material layer. The source region 120S and the drain region 120D are regions of such material layer which are doped with a conductive impurity at a relatively higher concentration than that of the conductive impurity of the lightly doped regions 120L. The channel region 120C is a region of such material layer which is doped with a conductive impurity at a relatively lower concentration than that of the conductive impurity of the lightly doped regions 120L. The conductive impurity may include a p-type impurity such as boron (B), gallium (Ga) and the like, and/or an N-type impurity such as phosphorus (P), arsenic (As), and the like.

A passivation layer 130 is disposed on the semiconductor layer 120. The passivation layer 130 may include a silicon oxide. The passivation layer 130 protects the semiconductor layer 120 in a manufacturing process of the transistor.

An alignment member 140 is disposed on the passivation layer 130. The alignment member 140 collectively includes a first alignment member 141 and a second alignment member 142. The first alignment member 141 and the second alignment member 142 are disposed in the same layer of the transistor among layers disposed on the substrate 100. Each of the first alignment member 141 and the second alignment member 142 may be formed from a same initial material layer. The first alignment member 141 and the second alignment member 142 respectively overlap the lightly doped regions 120L of the semiconductor layer 120.

In cross-section, the first alignment member 141 and the second alignment member 142 may have a shape of which a width thereof is gradually narrowed from the bottom thereof nearest the substrate 100 to the top thereof furthest from the substrate 100. The first alignment member 141 and the second alignment member 142 may include silicon oxide.

A first insulation layer 150 is disposed on the alignment member 140, the passivation layer 130 and the buffer layer 110. The first insulation layer 150 may be a single layer structure or a multilayer structure including at least one of a silicon nitride layer and a silicon oxide layer.

A gate electrode 160 is disposed on the first insulation layer 150. The gate electrode 160 overlaps the channel region 120C of the semiconductor layer 120. Further, outer edges of the gate electrode 160 may overlap the lightly doped regions 120L of the semiconductor layer 120 and the alignment member 140 and.

A second insulation layer 170 is disposed on the gate electrode 160 and the first insulation layer 150. The second insulation layer 170 may be a single layer structure or a multilayer structure including at least one of a silicon nitride layer and a silicon oxide layer.

A source electrode 181 and a drain electrode 182 that are disposed apart from each other are disposed on the second insulation layer 170. The source electrode 181 is connected with the source region 120S of the semiconductor layer 120 at and through a contact hole that is disposed in the second insulation layer 170 and the first insulation layer 150. The drain electrode 182 is connected with a drain region 120D of the semiconductor layer 120 at and through a contact hole that is disposed in the second insulation layer 170 and the first insulation layer 150. In the horizontal direction of FIG. 1, the alignment member 140 increases a spacing between the gate electrode 160, and each of the source and drain electrodes 181 and 182, respectively. As such, in one or more exemplary embodiment, inclusion of the alignment member 140 defines relatively wider gaps between the electrodes, as compared to a structure where the alignment member 140 is omitted.

The gate electrode 160, the source electrode 181 and the drain electrode 182 form a transistor, together with the semiconductor layer 120. A channel of the transistor is formed at and in the channel region 120C of the semiconductor layer 120 which is overlapped with the gate electrode 160. Since the semiconductor layer 120 includes the lightly doped regions 120L, a leakage current or a punch-through effect of the transistor can be reduced or effectively prevented.

According to the exemplary embodiment, gaps respectively between the source electrode 181, the drain electrode 182 and the gate electrode 160 are increased due to the alignment member 140. Accordingly, the source electrode 181, the drain electrode 182 and the gate electrode 160 can be formed to have relatively large dimensions while maintaining relatively wide gaps between the source electrode 181, the drain electrode 182 and the gate electrode 160. As described, the source electrode 181, the drain electrode 182 and the gate electrode 160 have relatively wide gaps therebetween so that parasitic capacitance formed between the source electrode 181, the drain electrode 182 and the gate electrode 160 can be reduced. Accordingly, reliability of the transistor can be improved.

In the exemplary embodiment, the illustrated transistor may be a top-gate type transistor because the gate electrode 160 is disposed higher than the semiconductor layer 120 with respect to the substrate 100. However, a structure of the transistor is not limited thereto, and may be variously changed. In an alternative exemplary embodiment, for example, the transistor may be a bottom-gate type of transistor in which the gate electrode is disposed below the semiconductor layer and closer to the substrate than the semiconductor layer.

The above-described transistor may be applied to various display devices which display images, such as with light. Hereinafter, a display device to which the above-described transistor is applied will be described with reference to FIG. 2 and FIG. 3.

Figure 2:
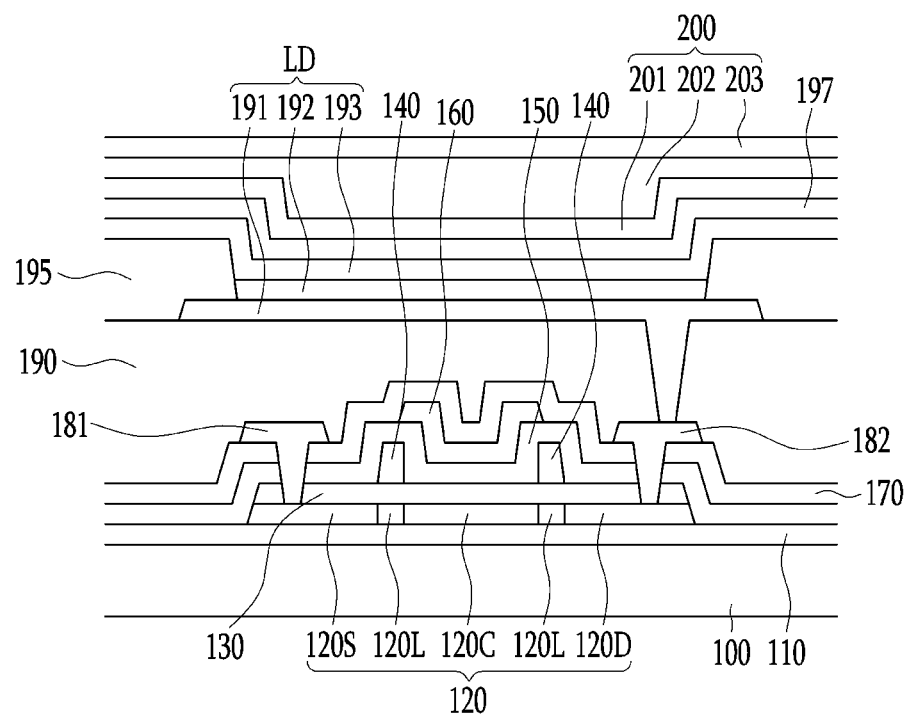
FIG. 2 and FIG. 3 are schematic cross-sectional views that respectively illustrate exemplary embodiments of a display device according to the invention.
Figure 3:
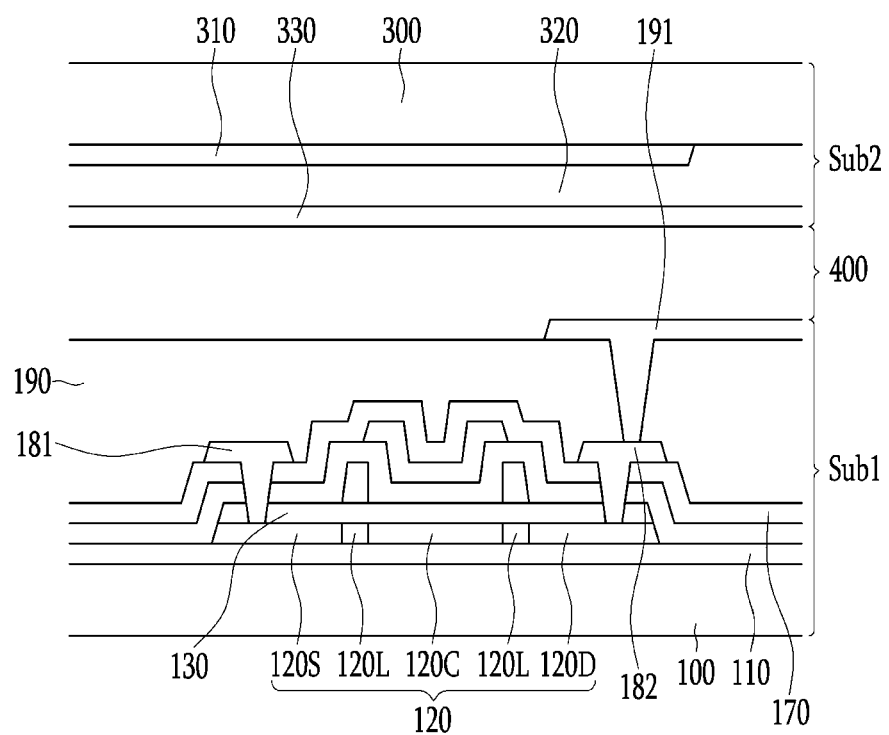

FIG. 2 and FIG. 3 are schematic cross-sectional views respectively illustrating exemplary embodiments of a display device according to the invention. The display device may generate and display an image with light. The transistor in such display device may switch a control or driving signal within the display device such that light is generated, blocked and/or transmitted to generate and display the image. The transistor may be disposed in a display area of the display device, but the invention is not limited thereto.

Referring to FIG. 2, an exemplary embodiment of a display device according to the invention includes the transistor of FIG. 1. Thus, the constituent elements described with reference to FIG. 1 will be briefly stated. Within the transistor, the buffer layer 110, the semiconductor layer 120, and the passivation layer 130 are sequentially disposed on the substrate 100 of the display device. The semiconductor layer 120 includes the source region 120S, the drain region 120D, the channel region 120C and the lightly doped regions 120L.

The alignment member 140 that includes a collection of the first alignment member 141 and the second alignment member 142 disposed apart from each other is disposed on the passivation layer 130, and the first insulation layer 150 is disposed on each of the alignment member 140, the passivation layer 130, and the buffer layer 110. The first alignment member 141 and the second alignment member 142 respectively overlap the lightly doped regions 120L of the semiconductor layer 120.

The gate electrode 160 is disposed on the first insulation layer 150, and the second insulation layer 170 is disposed on the gate electrode 160 and the first insulation layer 150. The gate electrode 160 overlaps the channel region 120C of the semiconductor layer 120. In addition, outer edges of the gate electrode 160 may overlap the alignment member 140 and the lightly doped regions 120L of the semiconductor layer 120.

The source electrode 181 and the drain electrode 182 that are disposed apart from each other are disposed on the second insulation layer 170. The source electrode 181 and the drain electrode 182 are connected to the source region 120S and the drain region 120D of the semiconductor layer 120 at and through contact holes that are disposed in the second insulation layer 170 and the first insulation layer 150.

A planarization layer 190 is disposed on the source electrode 181, the drain electrode 182 and the second insulation layer 170. The planarization layer 190 includes an organic material, and may have a flat upper surface.

A light emitting diode LD and a pixel defining layer 195 are disposed on the planarization layer 190. The light emitting diode LD generates and emits light according to a signal transmitted from the transistor. The light emitting diode LD includes a first electrode 191, a light emitting member 192 and a second electrode 193.

The first electrode 191 is disposed on the planarization layer 190, and is electrically connected with the drain electrode 182 at and through a contact hole disposed in the planarization layer 190. The first electrode 191 becomes an anode of the light emitting diode LD.

The first electrode 191 may include a reflective material, and may include a metal such as at least one of magnesium (Mg), silver (Ag), gold (Au), calcium (Ca), lithium (Li), chromium (Cr), and aluminum (Al) and an alloy thereof.

The pixel defining layer 195 is disposed on the planarization layer 190, and defines or includes an opening that overlaps the first electrode 191 to expose the first electrode 191. The pixel defining layer 195 may include an organic material.

The light emitting member 192 is disposed on the first electrode 191 that overlaps and is exposed by the opening of the pixel defining layer 195. The light emitting member 192 may include at least one of an emission layer, a hole injection layer ("HIL"), a hole transport layer ("HTL"), an electron transport layer ("ETL") and an electron injection layer ("EIL"). When the light emitting member 192 includes all of the aforementioned layers, the HIL is disposed on the first electrode 191 which is an anode, and the HTL, the emission layer, the ETL and the EIL may be sequentially laminated thereon. Here, the emission layer may include an organic material or an inorganic material.

The second electrode 193 is disposed on the pixel defining layer 195 and the light emitting member 192. The second electrode 193 may include a transparent material. The second electrode 193 may include indium tin oxide ("ITO"), indium gallium oxide ("IGO") or indium zinc oxide ("IZO"). Further, the second electrode 193 may include a thin silver-magnesium (Ag—Mg) alloy, a thin silver-lithium (Ag—Li) alloy, silver (Ag), magnesium (Mg), or calcium (Ca). The second electrode 193 becomes a cathode of the light emitting diode LD.

A capping layer 197 is disposed on the second electrode 193. The capping layer 197 helps light generated from the light emitting member 192 to be effectively emitted to outside the display device.

An encapsulation layer 200 is disposed on the capping layer 197. The encapsulation layer 200 encapsulates the light emitting diode LD to reduce or effectively prevent moisture or oxygen from penetrating from the outside. The encapsulation layer 200 includes a first inorganic layer 201, an organic layer 202 and a second inorganic layer 203. The first inorganic layer 201 is disposed on and closest to the capping layer 197, and may include an inorganic material. The organic layer 202 is disposed on the first inorganic layer 201, and may include an organic material. In addition, the organic layer 202 may have a flat upper surface. The second inorganic layer 203 is disposed on the organic layer 202, and may include an inorganic material. Further, the encapsulation layer 200 may include at least one organic layer and at least one inorganic layer that are sequentially disposed on the second inorganic layer 203. In this case, the organic layers and the inorganic layers may be alternately disposed.

Referring to FIG. 3, another exemplary embodiment of a display device according to the invention includes a first display panel Sub1, a second display panel Sub2, and an optical medium or light control/transmittance layer such as a liquid crystal layer 400 that is disposed between the first display panel Sub1 and the second display panel Sub2. Light generated externally from the display device may be blocked or transmitted by the optical medium layer to display an image.

First, the first display panel Sub1 will be described. The transistor of FIG. 1 is disposed in the first display panel Sub1. Thus, the constituent elements described with reference to FIG. 1 will be briefly stated.

Within the transistor, the buffer layer 110, the semiconductor layer 120 and the passivation layer 130 are sequentially disposed on the substrate 100 of the first display panel Sub1. The semiconductor layer 120 includes the source region 120S, the drain region 120D, the channel region 120C and the lightly doped regions 120L.

The alignment member 140 that includes a collection of the first alignment member 141 and the second alignment member 142 disposed apart from each other is disposed on the passivation layer 130, and the first insulation layer 150 is disposed on the alignment member 140, the passivation layer 130 and the buffer layer 110. The first alignment member 141 and the second alignment member 142 respectively overlap the lightly doped regions 120L of the semiconductor layer 120.

The gate electrode 160 is disposed on the first insulation layer 150, and the second insulation layer 170 is disposed on the gate electrode 160 and the first insulation layer 150. The gate electrode 160 overlaps the channel region 120C of the semiconductor layer 120. In addition, outer edges of the gate electrode 160 may overlap the alignment member 140 and the lightly doped regions 120L of the semiconductor layer 120.

The source electrode 181 and the drain electrode 182 that are disposed apart from each other are disposed on the second insulation layer 170. The source electrode 181 and the drain electrode 182 are connected to the source region 120S and the drain region 120D of the semiconductor layer 120 at and through contact holes that are disposed in the second insulation layer 170 and the first insulation layer 150.

The planarization layer 190 is disposed on the source electrode 181, the drain electrode 182 and the second insulation layer 170. The planarization layer 190 includes an organic material, and may have a flat upper surface.

The first electrode 191 is disposed on the planarization layer 190. The first electrode 191 is disposed on the planarization layer 190, and is electrically connected with the drain electrode 182 at and through a contact hole disposed in the planarization layer 190. The first electrode 191 may include a transparent material.

Next, the second display panel Sub2 will be described.

At one side of an opposed substrate 300, that is, in a side that faces the first display panel Sub1, a light blocking member 310 is disposed. A color filter 320 is disposed on the light blocking member 310 and between portions thereof, at the same side of the opposed substrate 300.

The opposed substrate 300 may include the same material as the substrate 100. The color filter 320 may display primary colors of red, green and blue. The color filter is not limited to displaying the primary colors of red, green and blue, and may also display other colors such as cyan, magenta, yellow and a white-based color. The light blocking member 310 and the color filter 320 may be disposed within the first display panel Sub1.

An opposed electrode 330 is disposed at the side of the color filter 320. The opposed electrode 330 may include a transparent material, and faces the first electrode 191 while interposing the liquid crystal layer 400 therebetween.

The opposed electrode 330 and the first electrode 191 generate an electric field in the liquid crystal layer 400 such that directions of liquid crystal molecules included in the liquid crystal layer 400 are determined. Luminance of light passing through the liquid crystal layer 400 varies according to the alignment directions of the liquid crystal molecules determined above.

Hereinafter, referring to FIG. 4 to FIG. 8 and FIG. 1 to FIG. 3, an exemplary embodiment of a method for manufacturing a display device according to the invention will be described.

FIG. 4 to FIG. 8 schematically show cross-sections of structures within an exemplary embodiment of a method for manufacturing a display device according to the invention.

Figure 4:
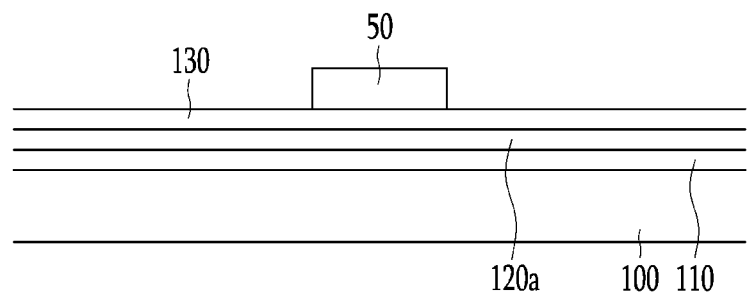
FIG. 4 to FIG. 8 are schematic cross-sectional view which show an exemplary embodiment of a method for manufacturing a display device according to the invention.

Referring to FIG. 4, a buffer layer 110, an amorphous silicon (initial) material layer 120a and a passivation layer 130 are sequentially formed on a substrate 100. A mask pattern 50 is formed on the passivation layer 130. The mask pattern 50 may include a metal. The mask pattern 50 is formed at an area of the substrate 100 at which a transistor will be disposed, and more particularly, at a channel region of such transistor.

Figure 5:
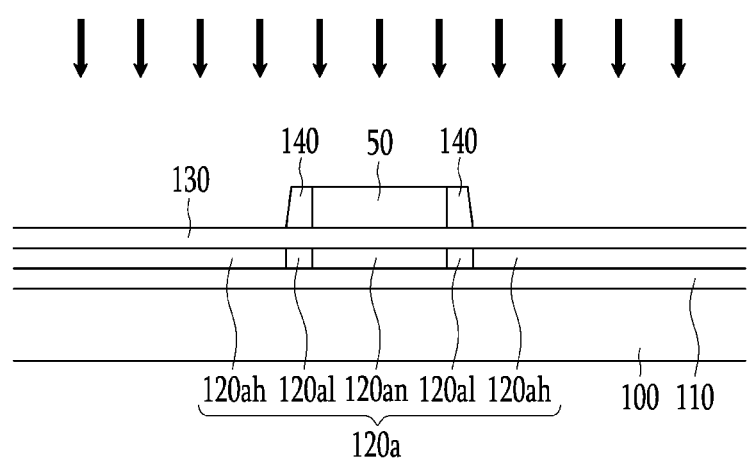

Referring to FIG. 5, an alignment member 140 is formed at a side of the mask pattern 50. Individual alignment members may be respectively formed at each of opposing sides of the mask pattern 50 at which a source and a drain electrode will be formed. With the alignment member 150 at sides of the mask pattern 50, a conductive impurity is injected into the amorphous silicon material layer 120a (refer to downward arrows in FIG. 5).

The alignment member 140 collectively includes individual members such as a first alignment member 141 and a second alignment member 142 that are disposed spaced apart from each other.

The conductive impurity may include a P-type impurity such as boron (B), gallium (Ga) and the like, and an N-type impurity such as phosphorus (P), arsenic (As) and the like. The conductive impurity is injected into the amorphous silicon material layer 120a through a first doping process through which conductive impurity ions are injected to a same amorphous silicon material layer 120a at different regions thereof.

In this case, the first-doped amorphous silicon layer 120a includes relatively heavily doped regions 120ah, relatively lightly doped regions 120al, and an amorphous silicon region 120an which may be considered a non-doped region. The lightly doped regions 120al are disposed between the heavily doped regions 120ah and the amorphous silicon region 120an.

The amorphous silicon region 120an is a region where the conductive impurity is not injected because the conductive impurity ions are blocked by the mask pattern 50 during the first doping process.

The lightly doped region 120al is a region that is relatively lightly doped with the conductive impurity as compared to the conductive impurity of the heavily doped region 120ah because the conductive impurity ions are partially blocked by the alignment member 140 during the first doping process.

Figure 6:
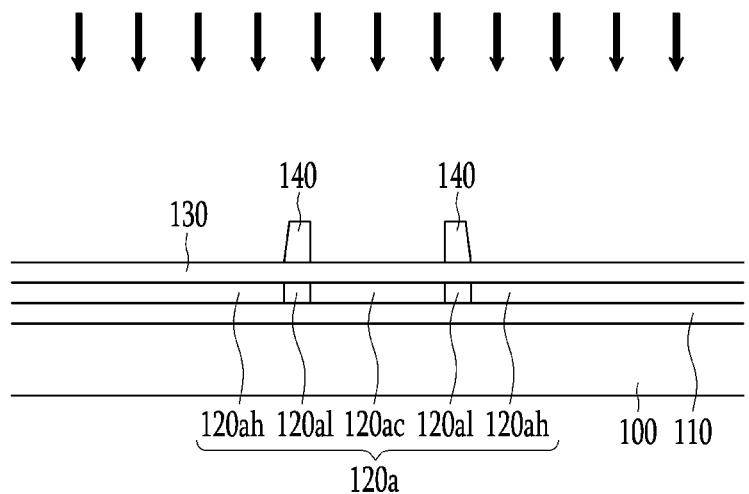

Referring to FIG. 6, the conductive impurity is injected to the first-doped amorphous silicon layer 120a after removing the mask pattern 50 (refer to the downward arrows in FIG. 6). With the amorphous silicon region 120an exposed from removal of the mask pattern 50, the conductive impurity is injected by performing a second doping process through which the conductive impurity ions are injected to the first-doped amorphous silicon layer 120a including the heavily doped regions 120ah, the lightly doped regions 120al, and the amorphous silicon region 120an. A concentration of the conductive impurity ions during the second doping process is lower than a concentration of the conductive impurity ions during the first doping process.

In this case, the conductive impurity is injected to the heavily doped region 120ah, the lightly doped region 120al and the amorphous silicon region 120an of the first-doped amorphous silicon layer 120a. Thus, the amorphous silicon region 120an of the first-doped amorphous silicon layer 120a becomes a preliminary channel region 120ac of the second-doped amorphous silicon layer 120a where the conductive impurity ions are only partially injected.

Figure 7:
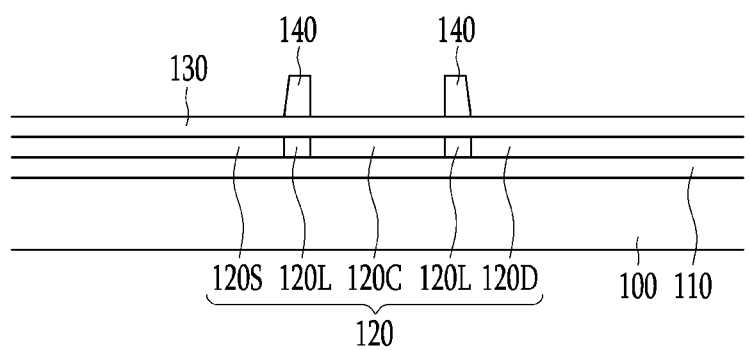

Referring to FIG. 7, the semiconductor layer 120 is formed by crystallizing the second-doped amorphous silicon layer 120a to polysilicon. The crystallization may be performed through excimer laser annealing ("ELA"). During the crystallization, a portion the second-doped amorphous silicon layer 120a where the conductive impurity ions are injected is activated.

Thus, the semiconductor layer 120 of the transistor includes a source region 120S, a drain region 120D, a channel region 120C and lightly doped regions 120L. The lightly doped regions 120L are disposed between the source region 120S, the drain region 120D and the channel region 120C along a surface of the substrate 100. As described above, the lightly doped region 120L may have a narrower width than each of the source region 120S, the drain region 120D and the channel region 120C.

The source region 120S and the drain region 120D are regions having a relatively higher concentration of the conductive impurity compared to a concentration of the conductive impurity of the lightly doped region 120L. The channel region 120C is an area having a relatively lower concentration of the conductive impurity compared to the concentration of the conductive impurity of the lightly doped region 120L.

Here, the first alignment member 141 and the second alignment member 142 overlap the lightly doped regions 120L of the semiconductor layer 120.

As described above, through a single annealing process, the un-activated amorphous silicon layer is crystallized to the polysilicon form and at the same time the portion where the conductive impurity ions are injected is activated. Accordingly no additional activation process is required. Accordingly, the processes in a method of manufacturing a transistor can be simplified and manufacturing cost can be saved.

Further, when a separate activation process is additionally performed, the flexible substrate 100 having the amorphous silicon layer thereon may be damaged due to temperature during the process. However, in one or more exemplary embodiment according to the invention, the damage of the substrate 100 can be reduced by simultaneously performing the crystallization of the amorphous silicon material layer 120a to the polysilicon and the activation of doped areas of the amorphous silicon material layer 120a as in the present exemplary embodiment.

Figure 8:
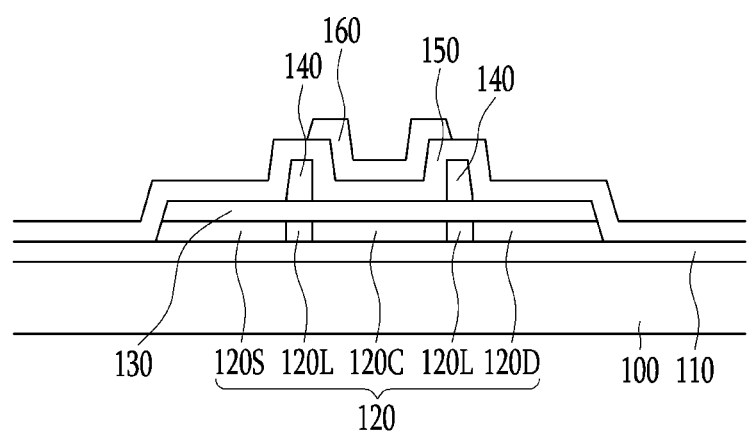

Referring to FIG. 8, at the transistor, a portion of the passivation layer 130, the source region 120S and the drain region 120D are removed such as by etching. The first insulation layer 150 is formed on the alignment member 140, the etched passivation layer 130, along sides of the source and drain regions 120S and 120D, and the buffer layer 110. A cross-sectional profile of the first insulation layer 150 includes a recess corresponding to the first and second alignment members 141 and 142 spaced apart from each other. The recess is disposed overlapping the channel region 120C of the semiconductor layer 120.

The gate electrode 160 is formed on the first insulation layer 150. The gate electrode 160 overlaps the channel region 120C of the semiconductor layer 120. More particularly, the gate electrode 160 is located at the channel region 120C by the recess of the first insulation layer 150. That is, the first and second alignment members 141 and 142 spaced apart from each other effectively function as an alignment member for aligning the gate electrode 160 relative to the channel region 120C.

When the gate electrode 160 is formed, misalignment of the gate electrode 160 can be reduced by using the alignment member 140 that overlaps the lightly doped regions 120L of the semiconductor layer 120 as an alignment mark.

Referring to FIG. 1, after forming the second insulation layer 170 on the gate electrode 160 and the first insulation layer 150, the source electrode 181 and the drain electrode 182 that are disposed apart from each other are formed on the second insulation layer 170. The source electrode 181 and the drain electrode 182 are connected with the source region 120S and the drain region 120D of the semiconductor layer 120 respectively at and through the contact holes disposed in the second insulation layer 170 and the first insulation layer 150. As such, a transistor may be finally formed.

Referring to FIG. 2, in a method of forming a display device, the planarization layer 190 is disposed on the source electrode 181, the drain electrode 182 and the second insulation layer 170 of the transistor, the light emitting diode LD and the pixel defining layer 195 are disposed on the planarization layer 190, the capping layer 197 is disposed on the light emitting diode LD, and then the encapsulation layer 200 is disposed on the capping layer 197.

The light emitting diode LD includes a first electrode 191, a light emitting member 192 and a second electrode 193. The first electrode 191 is disposed on the planarization layer 190, and is electrically connected with the drain electrode 182 at and through the contact hole disposed in the planarization layer 190. The light emitting member 192 is disposed on the first electrode 191 that overlaps the opening of the pixel defining layer 195. The second electrode 193 is disposed on the pixel defining layer 195 and the light emitting member 192.

The encapsulation layer 200 includes a first inorganic layer 201, an organic layer 202, and a second inorganic layer 203. As such, the display device of FIG. 2 may be finally formed.

Unlike the display device of FIG. 2, referring to FIG. 3, in a method of forming a display device, the planarization layer 190 is disposed on the source electrode 181, the drain electrode 182 and the second insulation layer 170 of the transistor, and the first electrode 191 is disposed on the planarization layer 190 such that the first display panel Sub1 is formed. The first electrode 191 is electrically connected with the drain electrode 182 at and through the contact hole disposed in the planarization layer 190.

The light blocking member 310 and the color filter 320 are disposed on one side of the opposed substrate 300 and then the opposed electrode 330 is disposed on the color filter 320 such that the second display panel Sub2 is formed.

After an optical medium layer such as a liquid crystal material is disposed on the first electrode 191 and/or the opposed electrode 330, the first display panel Sub1 and the second display panel Sub2 are bonded to each other such that the first electrode 191 and the opposed electrode 330 face each other. In this case, the liquid crystal layer 400 is formed between the first display panel Sub1 and the display panel Sub2.

Alternatively, the first display panel Sub1 and the second display panel Sub2 are bonded to each other to make the first electrode 191 and the opposed electrode 330 face each other, and then the liquid crystal layer 400 may be formed by injecting the liquid crystal material between the first display panel Sub1 and the second display panel Sub2 previously bonded to each other.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a semiconductor layer disposed on the substrate, and including a source region, a drain region, and a channel region which is between the source region and the drain region;
   a passivation layer disposed on the source region, the drain region and the channel region of the semiconductor layer;
   an alignment member layer on the passivation layer, the alignment member layer including a first alignment member and a second alignment member in a same layer and spaced apart from each other;
   a first insulation layer covering the passivation layer, the first alignment member, and the second alignment member;

a gate electrode on the first insulation layer and the alignment member layer; and a source electrode and a drain electrode connected to the source region and the drain region, respectively, wherein the first alignment member and the second alignment member are disposed for an alignment of the gate electrode and each of the passivation layer, the first alignment member, the second alignment member and the first insulation layer is disposed between the gate electrode and the semiconductor layer along a thickness direction of the substrate.

2. The display device of claim 1, wherein in a direction along the substrate, the first alignment member and the second alignment member are respectively disposed between the gate electrode, and the source electrode and the drain electrode.

3. The display device of claim 2, wherein in the direction along the substrate, the first insulation layer extends from between the gate electrode, and the first alignment member and the second alignment member, respectively, to be disposed between the first alignment member and the source electrode and between the second alignment member and the drain electrode.

4. The display device of claim 1, wherein the semiconductor layer comprises a polysilicon doped with a conductive impurity.

5. The display device of claim 4, wherein the semiconductor layer further comprises doped regions respectively disposed between the source region and the channel region and between the drain region and the channel region.

6. The display device of claim 5, wherein the first alignment member and the second alignment member are respectively disposed corresponding to the doped regions, and the gate electrode corresponds to the channel region.

7. The display device of claim 6, further comprising:

a planarization layer on the source electrode and the drain electrode;

a light emitting diode on the planarization layer and connected with the drain electrode; and an encapsulation layer on the light emitting diode.

8. The display device of claim 6, further comprising:

a planarization layer on the source electrode and the drain electrode;

a first electrode on the planarization layer and connected with the drain electrode;

an opposed electrode facing the first electrode; and an optical transmittance layer between the first electrode and the opposed electrode.

9. The display device of claim 1, wherein a shortest distance between the substrate and the alignment member layer is smaller than a shortest distance between the substrate and the gate electrode.

* * * * *